United States Patent
Xi

(10) Patent No.: US 10,984,696 B1
(45) Date of Patent: Apr. 20, 2021

(54) GATE ON ARRAY CIRCUIT AND DISPLAY PANEL

(71) Applicant: Shenzhen China Star Optoelectronics Semiconductor Display Technology Co., Ltd., Guangdong (CN)

(72) Inventor: Suping Xi, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 16/627,774

(22) PCT Filed: Dec. 27, 2019

(86) PCT No.: PCT/CN2019/128933
§ 371 (c)(1),
(2) Date: Dec. 31, 2019

(30) Foreign Application Priority Data

Dec. 19, 2019 (CN) .......................... 201911320660.7

(51) Int. Cl.
*G09G 3/20* (2006.01)
*H03K 19/017* (2006.01)

(52) U.S. Cl.
CPC .......... *G09G 3/20* (2013.01); *H03K 19/01735* (2013.01); *G09G 2310/0264* (2013.01); *G09G 2320/0219* (2013.01)

(58) Field of Classification Search
CPC .......................... G09G 3/20; H03K 19/01735
See application file for complete search history.

(56) References Cited

U.S. PATENT DOCUMENTS

| 2016/0109996 | A1* | 4/2016 | Ye | G02F 1/13306 345/173 |
|---|---|---|---|---|
| 2018/0218698 | A1 | 8/2018 | Li et al. | |
| 2019/0102261 | A1* | 4/2019 | Cesaretti | G06F 1/30 |
| 2019/0108783 | A1* | 4/2019 | Sun | G09G 3/2085 |
| 2019/0130858 | A1* | 5/2019 | Xiao | G09G 3/3677 |
| 2019/0130859 | A1* | 5/2019 | Dai | G11C 19/28 |
| 2019/0371415 | A1* | 12/2019 | Cesaretti | G11C 16/22 |

FOREIGN PATENT DOCUMENTS

| CN | 106128409 A | 11/2016 |
|---|---|---|
| CN | 207381069 U | 5/2018 |
| CN | 207409262 U | 5/2018 |
| CN | 108172157 A | 6/2018 |
| KR | 20190079189 A | 7/2019 |

* cited by examiner

Primary Examiner — Chun-Nan Lin
(74) Attorney, Agent, or Firm — Mark M. Friedman

(57) ABSTRACT

A gate on array (GOA) circuit and a display panel are provided. The GOA circuit includes a plurality of GOA units connected in series. A pull-up module includes a first switch, a second switch, a third switch and a fourth switch. When a $n^{th}$ stage signal STn corresponds to a high voltage level, the third switch is turned on and residual charges of the first switch, the second switch and the third switch are released through an output end of the fourth switch to prevent the residual charges from influencing performances of the first switch, the second switch, the third switch and the fourth switch.

9 Claims, 4 Drawing Sheets

GATE ON ARRAY CIRCUIT AND DISPLAY PANEL

FIELD OF THE INVENTION

The present invention relates to a display technique, and more particularly, to a gate on array (GOA) circuit and a display panel.

BACKGROUND OF THE INVENTION

A conventional GOA circuit comprises multiple modules. The pull-up control module is used to output a stable pull-up control signal to ensure the stability of the entire GOA circuit. However, the conventional pull-up control module has a problem. That is, the residual charges of switches cannot be released and thus may affect the threshold voltage of the switches such that the performances of the switches and the stability of the GOA circuit may be affected.

Therefore, the GOA circuit and the conventional display panel have the above issue due to the pull-up control module. And this issue needs to be solved.

SUMMARY OF THE INVENTION

One objective of an embodiment of the present invention is to provide a GOA circuit and a display panel to solve the above-mentioned issue of the performances of the switches due to the residual charges in the pull-up control module.

According to a first aspect of the present invention, a GOA circuit is disclosed. The GOA circuit comprises a plurality of GOA units connected in series of n stages, each of the GOA units is configured to output a scan signal and a stage signal, and an $n^{th}$-stage GOA comprises a pull-up control module, a pull-down control module, a pull-up module, a pull-down module, a pull-down maintaining module, a bootstrap capacitor and a signal transmission module. The pull-up module comprises a first switch, a second switch, a third switch and a fourth switch, and the pull-up module outputs a pull-up control signal when a $(n-4)^{th}$ stage signal STn−4 corresponds to a high voltage level and the scan signal Gn of the $n^{th}$-stage GOA corresponds to a low voltage level. When a $n^{th}$ stage signal STn corresponds to a high voltage level, the third switch is turned on and residual charges of the first switch, the second switch and the third switch are released through an output end of the fourth switch to prevent the residual charges from influencing performances of the first switch, the second switch, the third switch and the fourth switch.

According to an embodiment of the present invention, the first switch and the second switch are connected in series, and a control end of the first switch and a control end of the second switch are electrically connected to the $(n-4)^{th}$ stage signal STn−4; a control end of the third switch is electrically connected to a $(n+4)^{th}$ stage signal STn+4; and an output end of the third switch is electrically connected to a low voltage signal VSS.

According to an embodiment of the present invention, an output end of the first switch, an input end of the second switch, an input end of the third switch and the output end of the fourth switch are electrically connected to a node Mn; an input end of the fourth switch is electrically connected to the $n^{th}$ stage signal STn; and an input end of the fourth switch is electrically connected to the scan signal Gn of the $n^{th}$-stage GOA unit.

According to an embodiment of the present invention, when the $(n-4)^{th}$ stage signal STn−4 corresponds to a high voltage level and the scan signal Gn of the $n^{th}$-stage GOA unit corresponds to a low voltage level, the first switch and the second switch are turned on to output a stable pull-up control signal to charge a node Qn such that the node Qn and a node Mn correspond to a high voltage level.

According to an embodiment of the present invention, when the node Qn and a clock signal correspond to a high voltage level and the $n^{th}$ stage signal STn corresponds to a high voltage level, the scan signal Gn of the $n^{th}$-stage GOA unit becomes a high voltage level through the pull-up module; when the $(n-4)^{th}$ stage signal STn−4 corresponds to a high voltage level, the first switch and the second switch are turned off and the third switch is turned on, the scan signal Gn of the $n^{th}$-stage GOA unit is transferred to the node Mn, a $(n+4)^{th}$ stage signal STn+4 becomes a high voltage level, and charges of the first switch, the second switch and the third switch are released through the output end of the fourth switch.

According to an embodiment of the present invention, one end of the bootstrap capacitor is electrically connected to the pull-up module and another end of the bootstrap capacitor is electrically connected to the scan signal Gn of the $n^{th}$-stage GOA unit.

According to an embodiment of the present invention, one end of the pull-up module is electrically connected to a clock signal and another end of the pull-up module is electrically connected to the pull-down module; one end of the pull-down module is electrically connected to the pull-up module and another end of the pull-down module is electrically connected to a low voltage signal VSS; and the pull-down module outputs a $(n+4)^{th}$ stage signal STn+4.

According to an embodiment of the present invention, one end of the signal transmission module is electrically connected to a clock signal and another end of the signal transmission module is electrically connected to a low voltage signal VSS; the signal transmission module outputs the $n^{th}$ stage signal STn to control the third switch; and one end of the pull-down maintaining module is electrically connected to an output end of the second switch and another end of the pull-down maintaining module is electrically connected to a low voltage signal VSS.

According to a second aspect of the present invention, a GOA circuit is disclosed. The GOA circuit comprises a plurality of GOA units connected in series of n stages. An $n^{th}$-stage GOA comprises a pull-up control module, a pull-down control module, a pull-up module, a pull-down module, a pull-down maintaining module, a bootstrap capacitor and a signal transmission module. The pull-up module comprises a first switch, a second switch, a third switch and a fourth switch, and the pull-up module outputs a pull-up control signal when a $(n-4)^{th}$ stage signal STn−4 corresponds to a high voltage level and the scan signal Gn of the $n^{th}$-stage GOA corresponds to a low voltage level. When a $n^{th}$ stage signal STn corresponds to a high voltage level, the third switch is turned on and residual charges of the first switch, the second switch and the third switch are released through an output end of the fourth switch to prevent the residual charges from influencing performances of the first switch, the second switch, the third switch and the fourth switch.

According to an embodiment of the present invention, the first switch and the second switch are connected in series, and a control end of the first switch and a control end of the second switch are electrically connected to the $(n-4)^{th}$ stage signal STn−4; a control end of the third switch is electrically connected to a $(n+4)^{th}$ stage signal STn+4; and an output end of the third switch is electrically connected to a low voltage signal VSS.

According to an embodiment of the present invention, an output end of the first switch, an input end of the second switch, an input end of the third switch and the output end of the fourth switch are electrically connected to a node Mn; an input end of the fourth switch is electrically connected to the $n^{th}$ stage signal STn; and an input end of the fourth switch is electrically connected to the scan signal Gn of the $n^{th}$-stage GOA unit.

According to an embodiment of the present invention, when the $(n-4)^{th}$ stage signal STn-4 corresponds to a high voltage level and the scan signal Gn of the $n^{th}$-stage GOA unit corresponds to a low voltage level, the first switch and the second switch are turned on to output a stable pull-up control signal to charge a node Qn such that the node Qn and a node Mn correspond to a high voltage level.

According to an embodiment of the present invention, when the node Qn and a clock signal correspond to a high voltage level and the $n^{th}$ stage signal STn corresponds to a high voltage level, the scan signal Gn of the $n^{th}$-stage GOA unit becomes a high voltage level through the pull-up module; when the $(n-4)^{th}$ stage signal STn-4 corresponds to a high voltage level, the first switch and the second switch are turned off and the third switch is turned on, the scan signal Gn of the $n^{th}$-stage GOA unit is transferred to the node Mn, a $(n+4)^{th}$ stage signal STn+4 becomes a high voltage level, and charges of the first switch, the second switch and the third switch are released through the output end of the fourth switch.

According to an embodiment of the present invention, one end of the bootstrap capacitor is electrically connected to the pull-up module and another end of the bootstrap capacitor is electrically connected to the scan signal Gn of the $n^{th}$-stage GOA unit.

According to an embodiment of the present invention, one end of the pull-up module is electrically connected to a clock signal and another end of the pull-up module is electrically connected to the pull-down module; one end of the pull-down module is electrically connected to the pull-up module and another end of the pull-down module is electrically connected to a low voltage signal VSS; and the pull-down module outputs a $(n+4)^{th}$ stage signal STn+4.

According to an embodiment of the present invention, one end of the signal transmission module is electrically connected to a clock signal and another end of the signal transmission module is electrically connected to a low voltage signal VSS; the signal transmission module outputs the $n^{th}$ stage signal STn to control the third switch; and one end of the pull-down maintaining module is electrically connected to an output end of the second switch and another end of the pull-down maintaining module is electrically connected to a low voltage signal VSS.

According to an embodiment of the present invention, each of the first switch, the second switch, the third switch and the fourth switch is a thin film transistor or a field effect transistor.

According to an embodiment of the present invention, a display panel is disclosed. The display panel comprises the above-mentioned GOA circuit.

In contrast to the conventional art, an embodiment of the present invention provides a GOA circuit and a display panel. The pull-up module of the embodiment has an additional switch. The residual charges of the pull-up control module could be released through the additional switch. In this way, the pull-up control module could stably output the pull-up control signal without influencing the performances of the switches such that the characteristic of the GOA circuit could be more stable.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF PREFERRED EMBODIMENTS

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

It is understood that terminologies, such as "center," "longitudinal," "horizontal," "length," "width," "thickness," "upper," "lower," "before," "after," "left," "right," "vertical," "horizontal," "top," "bottom," "inner," "outer," "clockwise," and "counterclockwise," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

Figure 1:
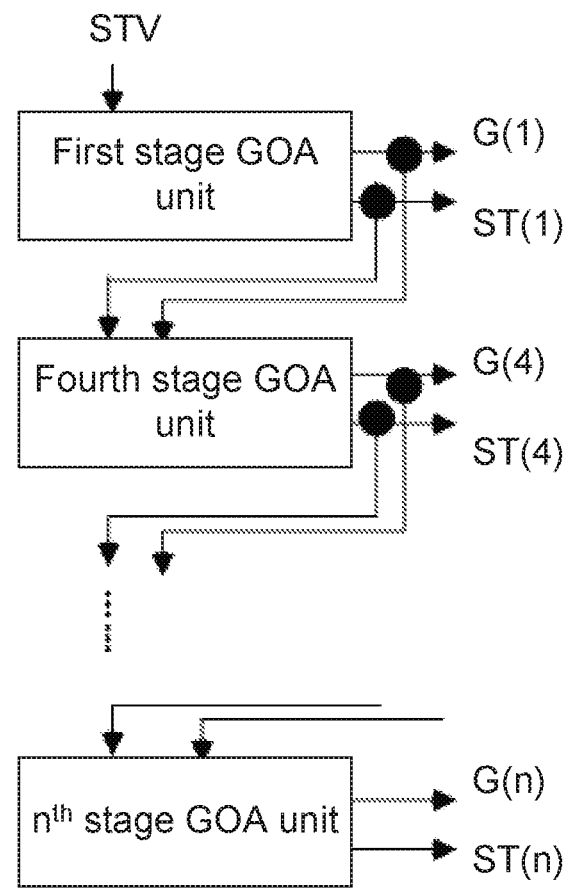
FIG. 1 is a diagram of a GOA circuit according to an embodiment of the present invention.

Please refer to FIG. 1. FIG. 1 is a diagram of a GOA circuit according to an embodiment of the present invention. The GOA circuit comprises a plurality of GOA units connected in series. Each stage of the GOA units is configured to output a scan signal and a stage signal. When the GOA circuit works, the first stage GOA receives a starting signal STV. And then, the fourth stage GOA unit, the seventh stage GOA unit, . . . , the $n^{th}$ stage GOA unit (the last GOA unit) are orderly activated to work.

Figure 2:
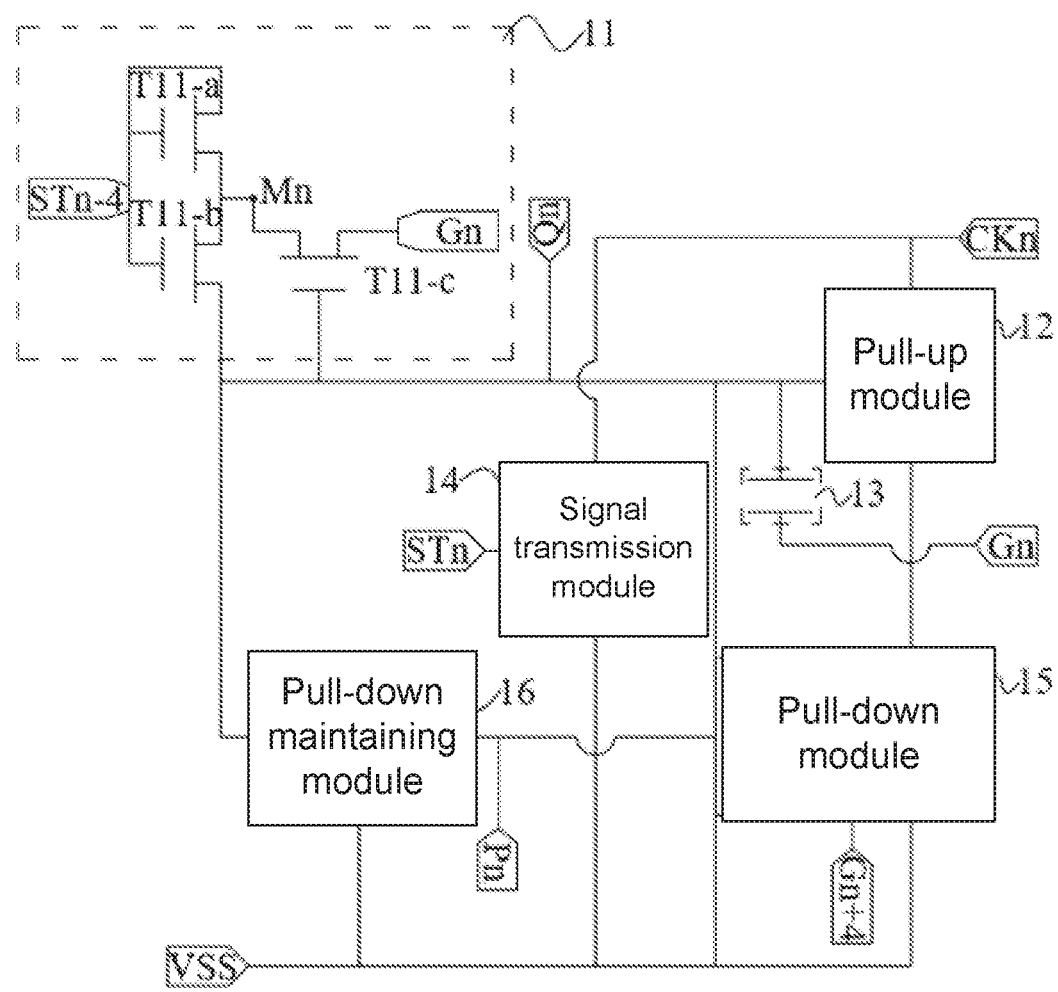
FIG. 2 is a circuit diagram of a GOA unit according to an embodiment of the present invention.

Please refer to FIG. 2. The GOA circuit comprises a pull-up control module 11, a pull-up module 12, a bootstrap capacitor 13, a signal transmission module 14, a pull-down module 15 and a pull-down maintaining module 16.

In this embodiment, the pull-up control module 11 receives a $(n-4)^{th}$ stage signal ST(n−4) and a scan signal Gn of this stage and outputs the pull-up control signal to the first node Qn for controlling the voltage level of the first node Qn according to the $(n-4)^{th}$ stage signal ST(n−4) and the scan signal Gn of this stage.

The pull-up module 12 receives the clock signal CKn of this stage and is electrically connected to the first node Qn. The pull-module is used to output the scan signal Gn of this stage under the control of the voltage level of the first node Qn.

The first end of the bootstrap capacitor 13 is electrically connected to the first node Qn and the second end of the bootstrap capacitor 13 is electrically connected to the scan signal Qn of this stage.

The signal transmission module 14 receives the clock signal CKn of this stage and is electrically connected to the first node Qn. The signal transmission module 14 is used to output the stage signal STn of this stage under the control of the voltage level of the first node Qn.

The pull-down module 15 receives the $(n+4)^{th}$ stage scan signal G(n+4) and the reference low voltage level signal VSS and is electrically connected to the first node Qn and the scan signal Gn of this stage. The pull-down module 15 is used to pull down the scan signal Gn of this stage and the voltage level of the first node Qn to the voltage level of the reference low voltage level signal VSS under the control of the $(n+4)^{th}$ stage scan signal G(n+4).

The pull-down maintaining module 16 receives the clock signal CKn of this stage and the reference low voltage level signal VSS and is electrically connected to the first node Qn and the second node Pn. The pull-down maintaining module is used to maintain the voltage level of the first node Qn and removes the residual charges of the pull-down maintaining module 16 according to the clock signal CKn of this stage and the reference low voltage level VSS.

In some embodiments, the pull-up control module 11 comprises the first switch T11-a, the second switch T11-b, the third switch T11-c. The control ends of the first switch T11-a and the second switch T11-b are electrically connected to the $(n-4)^{th}$ stage scan signal G(n−4). The output end of the second switch T11-b is electrically connected to the first node Qn. The control end of the third switch T11-c is electrically connected to the first node Qn. The input end of the third switch T11-c is electrically connected to the scan signal Qn of this stage. The output end of the first switch T11-a, the input end of the second switch T11-b and the output end of the third switch T11-c are electrically connected to the third node Mn.

Specifically, when the $(n-4)^{th}$ stage signal ST(n−4) corresponds to a high voltage level and the scan signal Gn of this stage corresponds to a low voltage level, the first switch T11-a and the second switch T11-b are turned on and the high voltage level of the $(n-4)^{th}$ stage signal ST(n−4) is transferred to the first node Qn through the first switch T11-a and the second switch T11-b. At this time, the first node Qn is precharged to a high voltage level, then the high voltage level of the first node Qn turns on the third switch T11-c. At this time, the scan signal Qn of this stage still corresponds to a low voltage level and the charges at the third node Mn are transferred to the scan signal Qn of this stage. When the $(n-4)^{th}$ stage signal ST(n−4) corresponds to a low voltage level, the first node Qn still corresponds to a high voltage level and the clock signal CKn corresponds to a high voltage level, the scan signal Gn of this stage becomes a high voltage level through the pull-up module 12. At this time, the first switch T11-a and the second switch T11-b are tuned off and the third switch T11-c is turned on. The scan signal Gn of this stage corresponds to a low voltage level, the first node Qn corresponds to a low voltage level and the $(n-4)^{th}$ stage signal ST(n−4) still corresponds to a low voltage level. Therefore, the first switch T11-a, the second switch T11-b and the third switch T11-c are turned off. However, in this way, the high voltage level of the third node Mn cannot be released and may influence the characteristics and the performances of connected switches.

Figure 3:
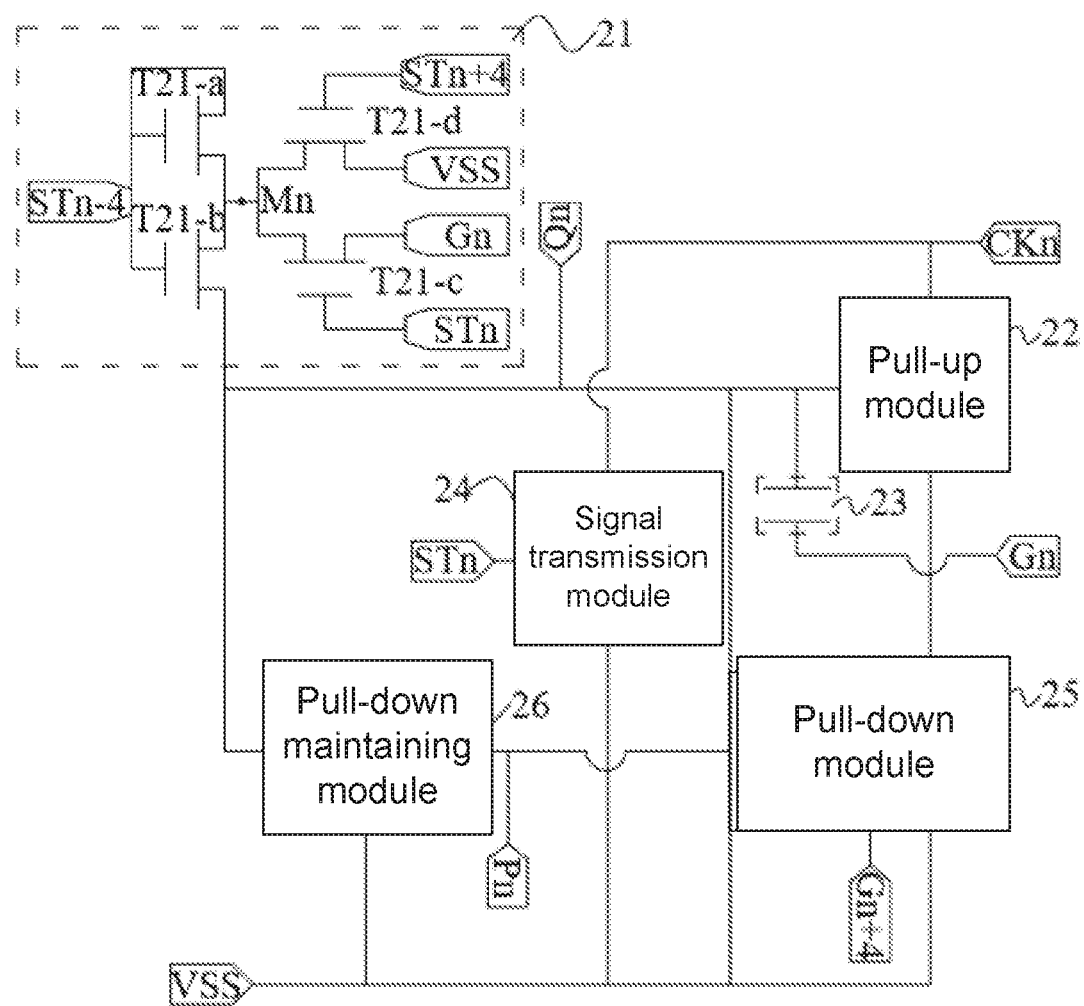
FIG. 3 is a circuit diagram of another GOA unit according to an embodiment of the present invention.

Please refer to FIG. 3. FIG. 3 is a circuit diagram of another GOA unit according to an embodiment of the present invention. The GOA circuit comprises a plurality of GOA units connected in series. The $n^{th}$ stage GOA unit comprises a pull-up control module 21, the pull-up module 22, the bootstrap capacitor 23, the signal transmission module 24, the pull-down module 25 and the pull-down maintaining module 26. The number n is larger than 4.

In the pull-up control module 21, when the $(n-4)^{th}$ stage signal ST(n−4) corresponds to a high voltage level, the first switch T21-a and the second switch T21-b are turned on to output a stable pull-up control signal Qn. The pull-up control signal Qn can be used to control the on/off of the pull-up module 22.

The output end of the pull-up control module 21 is electrically connected to the pull-up module 22 and outputs the scan signal Qn of this stage according to the pull-up control signal Qn and the clock signal CKn of this stage.

In addition, the pull-up control signal Qn outputted from the pull-up control module 21 is inputted into the pull-up module 22. At the same time, the clock signal CKn is also inputted into the pull-up module 22 such that the pull-up module 22 outputs the inputted clock signal CKn of this stage as the scan signal Gn of this stage according to the pull-up control signal Qn.

The bootstrap capacitor 23 is electrically connected to the output end of the pull-up control module 21. The bootstrap capacitor 23 is used to maintain the pull-up control signal Qn at the high voltage level during the period of outputting the scan signal Qn of this stage.

Specifically, one end of the bootstrap capacitor 23 is electrically connected to the pull-up control signal Qn and another end of the bootstrap capacitor 23 is electrically connected to the scan signal Qn of this stage.

The signal transmission module 24 is used to output the stage signal STn of this stage according to the clock signal CKn of this stage and the reference low voltage level signal VSS.

Furthermore, the signal transmission module 24 receives the clock signal CKn of this stage and utilizes the clock signal CKn of this stage to output the stage signal STn of this stage according to the reference low voltage level signal VSS.

The pull-down module 25 is electrically connected to the output end of the pull-up control module 21 and the output end of the pull-up module 22. The pull-down module 25 is used to pull down the pull-up control signal Qn to the reference low voltage level VSS according to the scan signal Gn of this stage and the $(n+4)^{th}$ stage scan signal G(n+4).

The pull-down maintaining module 26 is electrically connected to the pull-down module 25 and the control end of the pull-up control module 21. The pull-down maintaining module 26 is used to maintain the pull-up control signal Qn at the low voltage level.

Specifically, the pull-down maintaining module 26 receives the pull-up control signal from the first node Qn and outputs a signal to the second node Pn and thus is transferred to the pull-down module 25. When the pull-up control signal corresponds to a low voltage level, the second node Pn corresponds to a high voltage level such that the switch in the pull-down module 25 is turned on to pull down and maintain the pull-up control signal at the low voltage level.

In addition, the pull-up control module 21 comprises the first switch T21-$a$, the second switch T21-$b$, the third switch T21-$c$ and the fourth switch T21-$d$. The output end of the first switch T21-$a$, the input end of the second switch T21-$b$, the output end of the third switch T21-$c$ and the input end of the fourth switch T21-$d$ are electrically connected to the third node Mn. The control ends of the first switch T21-$a$ and the second switch T21-$b$ are electrically connected to the $(n-4)^{th}$ stage signal ST(n-4). The control end of the third switch T21-$c$ is electrically connected to the stage signal STn of this stage. The input end of the third switch T21-$c$ is electrically connected to the scan signal Gn of this stage. The control end of the fourth switch T21-$d$ is electrically connected to the $(n+4)^{th}$ stage signal ST(n+4). The output end of the fourth switch T21-$d$ is electrically connected to the reference low voltage level signal VSS.

Moreover, the pull-control module 21 is used to turn on the first switch and the second switch when the $(n-4)^{th}$ stage signal ST(n-4) corresponds to a high voltage level to output the pull-up control signal. When the pull-up control signal is inputted to the pull-up module 22 and the clock signal CKn of this stage is inputted to the pull-up module 22, the pull-up module outputs the scan signal Gn of this stage according to the pull-up control signal and the clock signal CKn of this stage. When the stage signal STn of this stage corresponds to a high voltage level, the third switch T21-$c$ is turned on. The scan signal Gn of this stage is transferred to the node Mn. When the $(n+4)^{th}$ stage signal ST(n+4) corresponds to a high voltage level, the fourth switch T21-$d$ is turned on such that the residual charges in the first switch T21-$a$, the second switch T21-$b$ and the third switch T21-$c$ are released to the reference low voltage level signal Vss through the output end of the fourth switch T21-$d$. Furthermore, at this time, the conductive voltages of the first switch T21-$a$, the second switch T21-$b$ and the third switch T21-$c$ are adjusted according to the pull-up control signal to output a stable pull-up control signal.

Moreover, in the above disclosure, when we mention that the pull-up control module 21 is turned on or conductive, this means that the first switch T21-$a$ and the second switch T21-$b$ are turned on or conductive. That is, the first switch T21-$a$ and the second switch T21-$b$ are turned on to output the pull-up control signal. At this time, the voltage level of the pull-up control signal is too high and thus the characteristic is unstable. Therefore, the voltage inputted to the control ends of the first switch T21-$a$ and the second switch T21-$b$ is adjusted to adjust the voltage level of the pull-up control signal outputted from the first switch T21-$a$ and the second switch T21-$b$ such that the pull-up control signal could be stable at a high voltage level.

In addition, the pull-up control module 21 further comprises the third switch T21-$c$.

When the pull-up control module 21 turns on the first switch T21-$b$ when the $(n-4)^{th}$ stage signal ST(n-4) corresponds to a high voltage level to output a pull-up control signal having a high voltage level. When the pull-up control signal corresponds to a high voltage level, the third switch T21-$c$ is turned on to reduce the conductive voltage of the first switch T21-$b$ to output a stable pull-up control signal.

Figure 4:
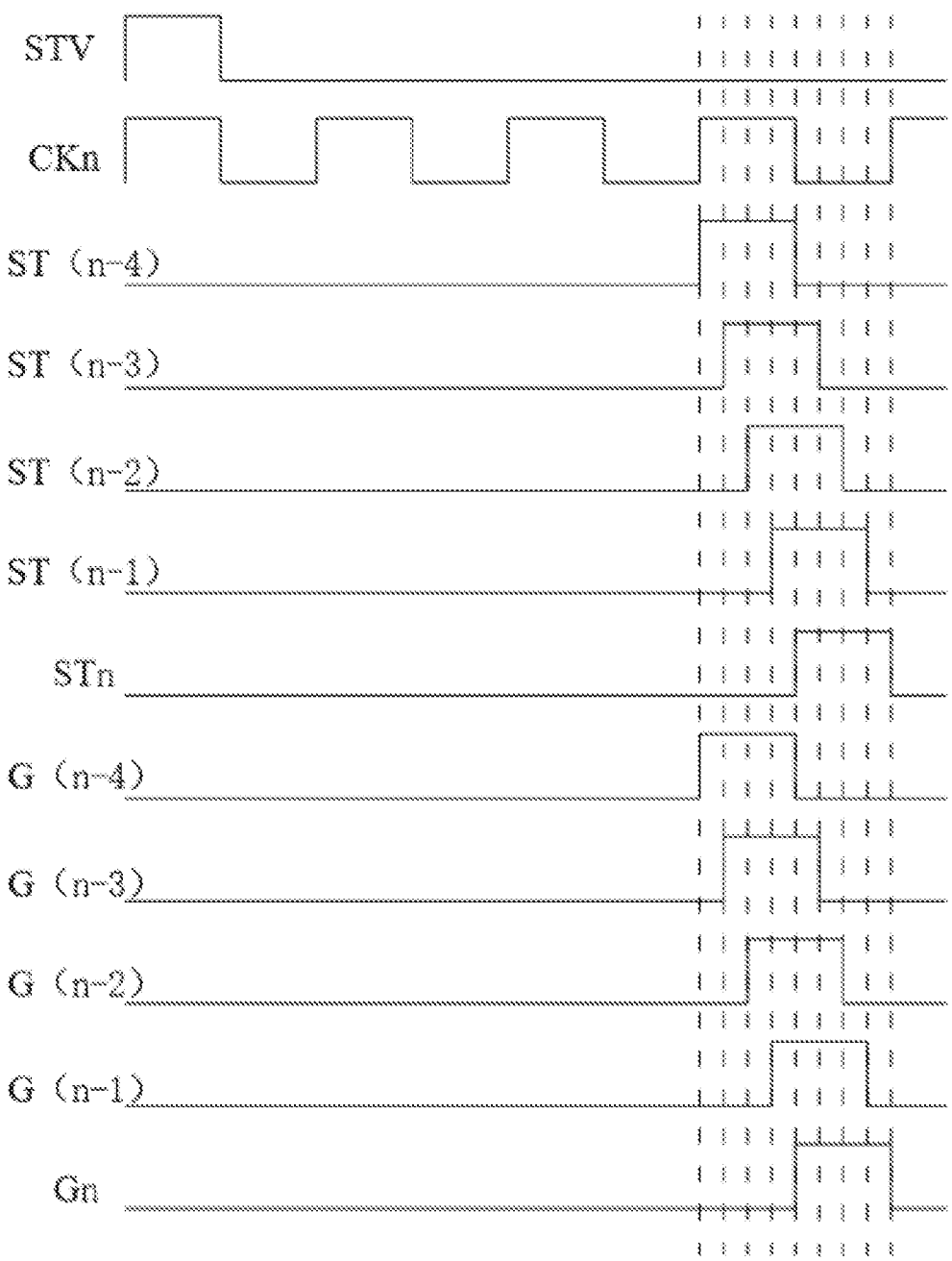
FIG. 4 is a timing diagram of signals in the GOA unit of the GOA circuit according to an embodiment of the present invention.

Please refer to FIG. 4. The $(n-4)^{th}$ stage signal ST(n-4) and the stage signal STn of this stage have a phase difference of a half period. That is, the stage signal STn of this stage is a half period behind the $(n-4)^{th}$ stage signal ST(n-4). The $(n-4)^{th}$ stage scan signal G(n-4) and the scan signal Gn of this stage have a phase difference of a half period. That is, the scan signal Gn of this stage is a half period behind the $(n-4)^{th}$ stage scan signal G(n-4). When the inputted $(n-4)^{th}$ stage signal ST(n-4) corresponds to a high voltage level, the first switch T21-$a$ and the second switch T21-$b$ are turned on such that the $(n-4)^{th}$ stage signal ST(n-4) having a high voltage level is transferred to the pull-up module 22 through the first node Qn. Thus, the first switch T21-$b$ is turned on such that the pull-up control module 21 outputs the pull-up control signal having a high voltage level. When the pull-up control signal corresponds to a high voltage level, the pull-up module 22 makes the scan signal Gn of this stage have a high voltage level under the impact of the clock signal CKn. When the stage signal STn of this stage corresponds to a high voltage level, the third switch T21-$c$ is turned on such that a feedback current is transferred to the first switch T21-$a$ and the second switch T21-$b$ through the input end and the output end (the third node Mn) of the third switch T21-$c$. When the second switch T21-$a$ and the third switch T21-$c$ are turned on, the conductive voltage of the first switch T21-$a$ is reduced but still enough to turn on the first switch T21-$a$ due to the voltage distribution ratio. Therefore, the first switch T21-$a$ faces less current stress and thus the pull-up control module could output a stable pull-up control signal.

Specifically, the control ends of the first switch T21-$a$ and the second switch T21-$b$ are electrically connected to the $(n-4)^{th}$ stage signal ST(n-4). The input end of the first switch T21-$a$ is electrically connected to the $(n-4)^{th}$ stage signal ST(n-4). The output end of the second switch T21-$b$ outputs the pull-up control signal.

In the above embodiments, the switch could be a thin film transistor, a field effect transistor, or any other device having a similar characteristic. In addition, in order to distinguish two ends other than the gate, the two ends are called as source and drain. The source and the drain of the transistor are symmetric and thus the source and the drain could be replaced with each other. In the above figures, the middle end of the switch transistor is the gate, the signal input end is the source, and the signal output end is the drain. Moreover, the N-type transistor is turned on when a high voltage level is applied to the gate and is turned off when a low voltage level is applied to the gate. The P-type transistor is turned on when a low voltage level is applied to the gate and is turned off when a high voltage level is applied to the gate.

From the above, the pull-up module of an embodiment has an additional switch. The residual charges of the pull-up control module could be released through the additional switch. In this way, the pull-up control module could stably output the pull-up control signal without influencing the performances of the switches such that the characteristic of the GOA circuit could be more stable.

Above are embodiments of the present invention, which does not limit the scope of the present invention. Any modifications, equivalent replacements or improvements within the spirit and principles of the embodiment described above should be covered by the protected scope of the invention.

What is claimed is:

1. A gate on array (GOA) circuit, comprising:
a plurality of GOA units connected in series, each of the GOA units being configured to output a scan signal and a stage signal, wherein an $n^{th}$-stage GOA unit comprises:
a bootstrap capacitor;
a signal transmission module;
a pull-down module;
a pull-down maintaining module;
a pull-up module, coupling a clock signal, the bootstrap capacitor, and the pull-down module;
a pull-up control module, coupling the pull-down maintaining module and the bootstrap capacitor, wherein the pull-up control module outputs a pull-up control signal when a $(n-4)^{th}$ stage signal STn-4 corresponds to a high voltage level and the scan signal Gn of the $n^{th}$-stage GOA unit corresponds to a low voltage level, and the pull-up control module comprises:
a first switch, wherein a control end of the first switch is electrically connected to the $(n-4)^{th}$ stage signal STn-4;
a second switch connected to the first switch in series, wherein a control end of the second switch is electrically connected to the $(n-4)^{th}$ stage signal STn-4;
a third switch, wherein a control end of the third switch is electrically connected to a $(n+4)^{th}$ stage signal STn+4, an output end of the third switch is electrically connected to a low voltage signal VSS; and
a fourth switch,
wherein when a $n^{th}$ stage signal STn corresponds to a high voltage level, the third switch is turned on so that residual charges of the first switch, the second switch and the third switch are released through an output end of the fourth switch to prevent the residual charges from influencing performances of the first switch, the second switch, the third switch and the fourth switch.

2. The GOA circuit of claim 1, wherein an output end of the first switch, an input end of the second switch, an input end of the third switch and the output end of the fourth switch are electrically connected to a node Mn; an input end of the fourth switch is electrically connected to the $n^{th}$ stage signal STn; and an input end of the fourth switch is electrically connected to the scan signal Gn of the $n^{th}$-stage GOA unit.

3. The GOA circuit of claim 1, wherein when the $(n-4)^{th}$ stage signal STn-4 corresponds to a high voltage level and the scan signal Gn of the $n^{th}$-stage GOA unit corresponds to a low voltage level, the first switch and the second switch are turned on to output a stable pull-up control signal to charge a node Qn such that the node Qn and a node Mn correspond to a high voltage level.

4. The GOA circuit of claim 3, wherein when the node Qn and the clock signal correspond to a high voltage level and the $n^{th}$ stage signal STn corresponds to a high voltage level, the scan signal Gn of the $n^{th}$-stage GOA unit becomes a high voltage level through the pull-up module; when the $(n-4)^{th}$ stage signal STn-4 corresponds to a high voltage level, the first switch and the second switch are turned off and the third switch is turned on, the scan signal Gn of the $n^{th}$-stage GOA unit is transferred to the node Mn, a $(n+4)^{th}$ stage signal STn+4 becomes a high voltage level, and charges of the first switch, the second switch and the third switch are released through the output end of the fourth switch.

5. The GOA circuit of claim 1, wherein one end of the bootstrap capacitor is electrically connected to the pull-up module and another end of the bootstrap capacitor is electrically connected to the scan signal Gn of the $n^{th}$-stage GOA unit.

6. The GOA circuit of claim 1, wherein one end of the pull-up module is electrically connected to the clock signal and another end of the pull-up module is electrically connected to the pull-down module; one end of the pull-down module is electrically connected to the pull-up module and another end of the pull-down module is electrically connected to a low voltage signal VSS; and the pull-down module outputs a $(n+4)^{th}$ stage signal STn+4.

7. The GOA circuit of claim 1, wherein one end of the signal transmission module is electrically connected to the clock signal and another end of the signal transmission module is electrically connected to a low voltage signal VSS; the signal transmission module outputs the $n^{th}$ stage signal STn to control the third switch; and one end of the pull-down maintaining module is electrically connected to an output end of the second switch and another end of the pull-down maintaining module is electrically connected to a low voltage signal VSS.

8. The GOA circuit of claim 1, wherein each of the first switch, the second switch, the third switch and the fourth switch is a thin film transistor or a field effect transistor.

9. A display panel, comprising the GOA circuit of claim 1.

* * * * *